(12) United States Patent
Park

(10) Patent No.: US 7,492,589 B2
(45) Date of Patent: Feb. 17, 2009

(54) COOLING APPARATUS FOR FLAT DISPLAY DEVICE

(75) Inventor: Sang Don Park, Daegu (KR)

(73) Assignee: LG Electronics Inc., Seoul (KR)

( * ) Notice: Subject to any disclaimer, the term of this patent is extended or adjusted under 35 U.S.C. 154(b) by 5 days.

(21) Appl. No.: 11/505,824

(22) Filed: Aug. 18, 2006

(65) Prior Publication Data

US 2007/0103909 A1 May 10, 2007

(30) Foreign Application Priority Data

Nov. 4, 2005 (KR) ...................... 10-2005-0105178

(51) Int. Cl.
*H05K 7/20* (2006.01)
*H05K 5/00* (2006.01)
*F28F 7/00* (2006.01)

(52) U.S. Cl. ...................... 361/695; 361/692; 361/694; 454/184; 165/80.2

(58) Field of Classification Search ......... 681/681–682, 681/687, 690, 692, 694–695; 165/80.3, 104.33, 165/121–122, 80.2; 454/184; 313/46; 345/60, 345/905; 348/748; 349/161; 415/53.1–53.3
See application file for complete search history.

(56) References Cited

U.S. PATENT DOCUMENTS

| | | | | | |
|---|---|---|---|---|---|
| 4,652,101 | A | * | 3/1987 | Grunwald | .................... 353/122 |
| 4,958,500 | A | * | 9/1990 | Kuroda et al. | .................. 62/89 |
| 5,623,392 | A | * | 4/1997 | Ma | .............................. 361/681 |
| 5,869,919 | A | * | 2/1999 | Sato et al. | ....................... 313/17 |
| 6,697,250 | B2 | * | 2/2004 | Kuo | ............................ 361/681 |
| 6,833,674 | B2 | * | 12/2004 | Kaneko et al. | .............. 313/587 |
| 7,164,586 | B2 | * | 1/2007 | Lin | .............................. 361/714 |
| 2004/0223299 | A1 | * | 11/2004 | Ghosh | ......................... 361/687 |
| 2006/0082271 | A1 | * | 4/2006 | Lee et al. | ....................... 313/35 |
| 2006/0164804 | A1 | * | 7/2006 | Kim et al. | .................... 361/688 |
| 2006/0199514 | A1 | * | 9/2006 | Kimura | ...................... 454/237 |
| 2007/0103863 | A1 | * | 5/2007 | Kim | ............................ 361/687 |
| 2007/0103864 | A1 | * | 5/2007 | Kim | ............................ 361/687 |
| 2007/0103865 | A1 | * | 5/2007 | Kim | ............................ 361/694 |
| 2007/0103866 | A1 | * | 5/2007 | Park | ........................... 361/695 |
| 2008/0083527 | A1 | * | 4/2008 | Horng et al. | ................ 165/80.3 |

FOREIGN PATENT DOCUMENTS

| | | | |
|---|---|---|---|
| JP | 2000-156581 | | 6/2000 |
| JP | 2000156581 A | * | 6/2000 |
| JP | 2001-102681 | | 4/2001 |
| JP | 2003029648 A | * | 1/2003 |

* cited by examiner

*Primary Examiner*—Jayprakash N Gandhi
*Assistant Examiner*—Bradley H Thomas
(74) *Attorney, Agent, or Firm*—Ked & Associates, LLP

(57) ABSTRACT

Provided is a cooling apparatus for a flat display device. The cooling apparatus includes a flat display module, a cover for protecting the flat display module, an air inlet formed on a portion of the cover to allow external air to be introduced into the cover, an air outlet formed on one of four frame portions of the cover to allow the air introduced through the air inlet to be exhausted out of the cover, and a fan for directing the air in a direction extending from a screen surface of the flat display device.

14 Claims, 10 Drawing Sheets

COOLING APPARATUS FOR FLAT DISPLAY DEVICE

BACKGROUND OF THE INVENTION

1. Field of the Invention

The present invention relates to a flat display device, and more particularly, a cooling apparatus for a flat display device, which can quickly dissipate internal heat to an external side.

2. Description of the Related Art

Unlike a cathode ray tube (CRT), a flat display uses a driving circuit arranged in a matrix pattern to differently excite pixels and thus realize an image. Recently, the flat display device has been widely used as it has advantageous in that it takes up a relatively small space. A variety of flat display modules such as a liquid crystal display (LCD), a field emission display (FED), a plasma display panel (PDP), and an electro-luminescence (EL) have been applied to the flat display device.

The flat display device using the flat display module is reduced in a thickness as compared with the CRT. However, since a large number of heat-generating components must be incorporated in a narrow space of the display device, the heat, which is generated by the heat-generating components in the flat display device during the operation of the flat display module, must be effectively dissipated to an external side.

Particularly, in the case of the PDP, since the image is realized by electric discharge of discharge gas, high temperature heat is generated. Therefore, if the high temperature heat is not quickly dissipated, the display device may malfunction. Needless to say, in the case of other types of flat display devices, the heat dissipation performance is very important fact determining the quality thereof.

In order to locally dissipate the heat, a heat sink is attached on a rear surface of a specific component generating a large amount of heat to cool the specific component. Furthermore, in order to generally dissipate the heat, a plurality of holes are formed on a cover of the flat display device so that cool air can pass through the holes. However, although the cooling effect for the specific component can be expected, the heat is not effectively dissipated to the external side. Therefore, the flat display device cannot be stably operated. That is, the internal temperature of the flat display device increases to deteriorate the performance of the flat display device.

In order to solve the above problem, an axial fan is installed on a rear center of a back cover in a direction perpendicular to a direction where the display device is formed. The axial fan forcedly exhausts the internal high temperature air of the flat display device to the external side through a rear side of the display device.

In this case, although the heat collected in the display device can be effectively discharged to the external side, excessive noise is generated during the operation of the axial fan. Furthermore, a gap of ten or more centimeters must be provided between the rear surface of the display device and the wall so that the air can be exhausted. In addition, due to a gap between the axial fan and the flat display module and a thickness of the axial fan, an overall thickness of the flat display device increases.

Furthermore, a plurality of holes through which the air is exhausted and introduced are formed on the back cover. The holes of the back cover deteriorate strength of the back cover. Therefore, the back cover must be enough thick. In this case, the manufacturing cost increases.

SUMMARY OF THE INVENTION

Accordingly, the present invention is directed to a cooling apparatus for a flat display device that substantially obviates one or more problems due to limitations and disadvantages of the related art.

An object of the present invention is to provide a cooling apparatus for a flat display device, which is designed to make the flat display device slimmer and effectively dissipate internal heat of the flat display device.

Another object of the present invention is to provide a cooling apparatus for a flat display device, which can minimize noise and be manufactured with low costs.

Still another object of the present invention is to provide a cooling apparatus for a flat display device, which can minimize noise and improve heat dissipation efficiency by allowing internal air of the flat display device to be exhausted by natural convection.

Still yet another object of the present invention is to provide a cooling apparatus for a flat display device, which can improve a degree of installation free of the display device by improving an airflow direction in the flat display device.

Still yet another object of the present invention is to provide a cooling apparatus for a flat display device, which can enhance strength of a back cover by improving location and structure of holes formed on the back cover.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a cooling apparatus for a flat display device, including: a flat display module; a cover for protecting the flat display module; an air inlet formed on a portion of the cover to allow external air to be introduced into the cover; an air outlet formed on one of four frame portions of the cover to allow the air introduced through the air inlet to be exhausted out of the cover; and a fan for directing the air in a direction extending from a screen surface of the flat display device.

According to another aspect of the present invention, there is provided a cooling apparatus for a rectangular flat display device, including: an air inlet formed on one of upper and lower and left and right frame portions of the flat display device; an air outlet formed on one of the four frame portions of the flat display device; and a fan for forcedly direction air from the air inlet to the air outlet.

According to still another aspect of the present invention, there is provided a cooling apparatus for a flat display device, including: an air inlet formed on a portion of the flat display device to allow external air to be introduced into the flat display device; an air outlet formed on a portion of the flat display device to allow the air introduced through the air inlet to be exhausted out of the flat display device; and a fan for forcedly directing the air from the air inlet to the air outlet, wherein the air is exhausted in a direction extending from a screen surface of the flat display device; and the fan is installed near one of the air inlet and the air outlet in the flat display device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1:
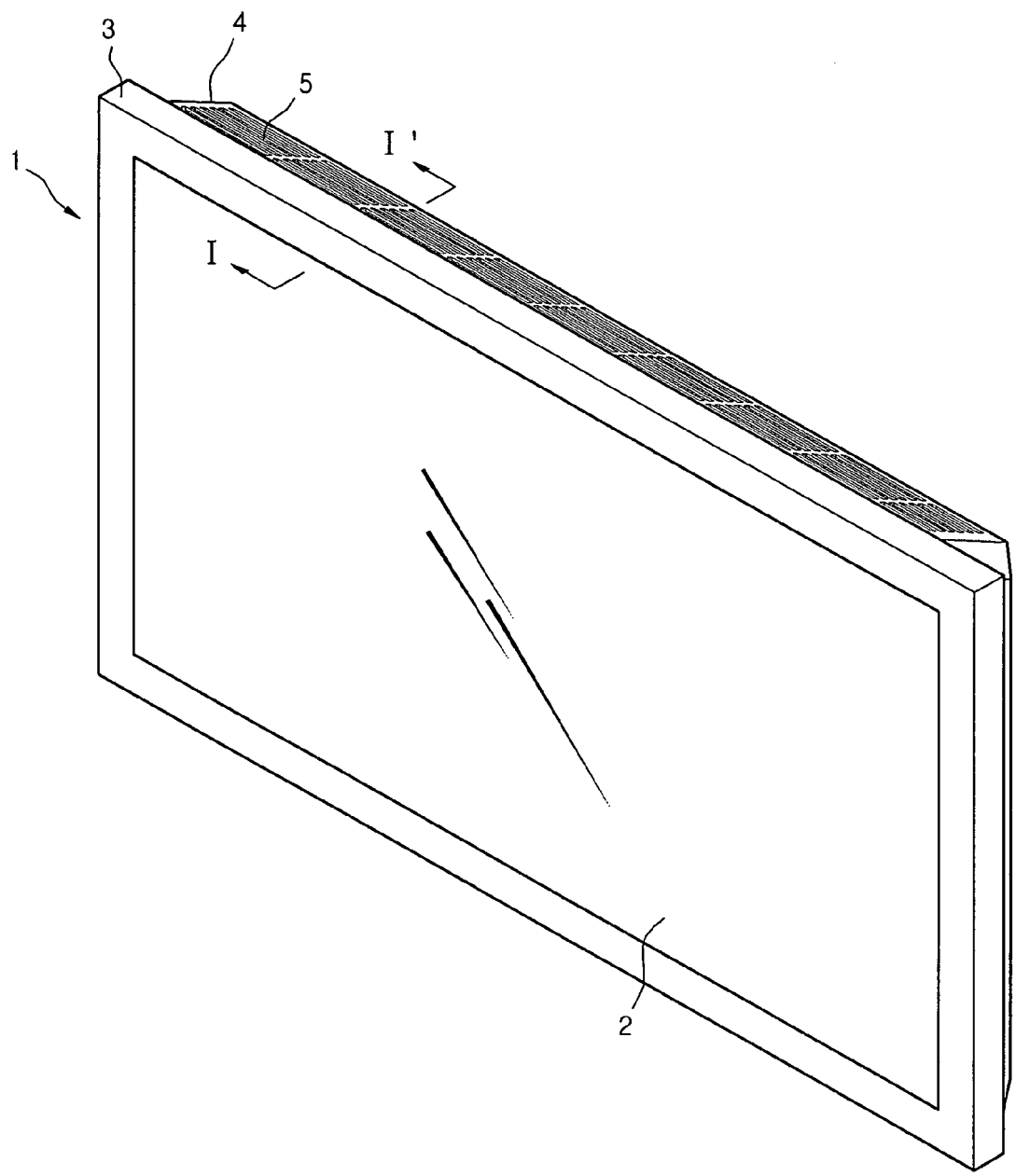
FIG. 1 is a perspective view of a flat display device having a cooling apparatus according to an embodiment of the present invention.

FIG. 1 is a perspective view of a flat display device according to an embodiment of the present invention.

Referring to FIG. 1, a flat display device 1 of this embodiment includes a flat display module 2, a front cover 3 for supporting and protecting a front portion of the flat display module 2, and a back cover 4 for supporting and protecting a rear portion of the flat display module 2. An air outlet 5 through which internal hot air of the flat display device 1 is exhausted is formed on an upper frame of the back cover 4. The air outlet 5 has a plurality of slits. The slits are arranged not to deteriorate strength of the back cover 4. That is, the slits are collected in an area of the air outlet 5.

The flat display module 2 may be selected from the group consisting of an LCD, an FED, a PDP, and an EL. Preferably, the flat display module 2 may be the PDP generating high temperature heat.

The front and back covers 3 and 4 define a space for receiving the flat display module 2 and protect components disposed in the space. The front and back covers 3 and 4 are independent parts that are assembled with each other. However, the present invention is not limited to this case. For example, the front and rear covers 3 and 4 may be integrated with each other as a single body as far as they can protect the front and rear portions of the display device. There is a predetermined gap between a heat generating component provided on a surface of the flat display module 2 and an inner surface of the back cover 4 so that air flows through the gap to cool the heat generating component and is then exhausted through the air outlet 5.

The operation of a cooling apparatus of the present invention will now be described with reference to the above flat display device.

When the flat display device 1 operates, a large amount of heat is generated in the flat display module 2. At this point, the hot air generated from the heat generating component disposed on the rear surface of the flat display module 2 is cooled by the incoming air. Then, the hot air flows upward and is then exhausted through the air outlet 5. This is the natural convection for exhausting the hot air out of the flat display device, thereby improving the cooling efficiency. At this point, it is more preferable to allow outer air to be introduced through an overall area of the bottom portion of the flat display device 1 and exhausted through the upper portion of the flat display device 1 via an overall area of the rear portion of the display device.

Furthermore, the air outlet 5 is provided on an inclined upper portion of the back cover so that the hot air can be exhausted upward and thus the hot air can more effectively flow.

In addition, since the front surface of the flat display module 2 is exposed to the external side, the heat generated from the front portion of the display module 2 can be quickly dissipated by the natural convection of the outer air.

Figure 2:
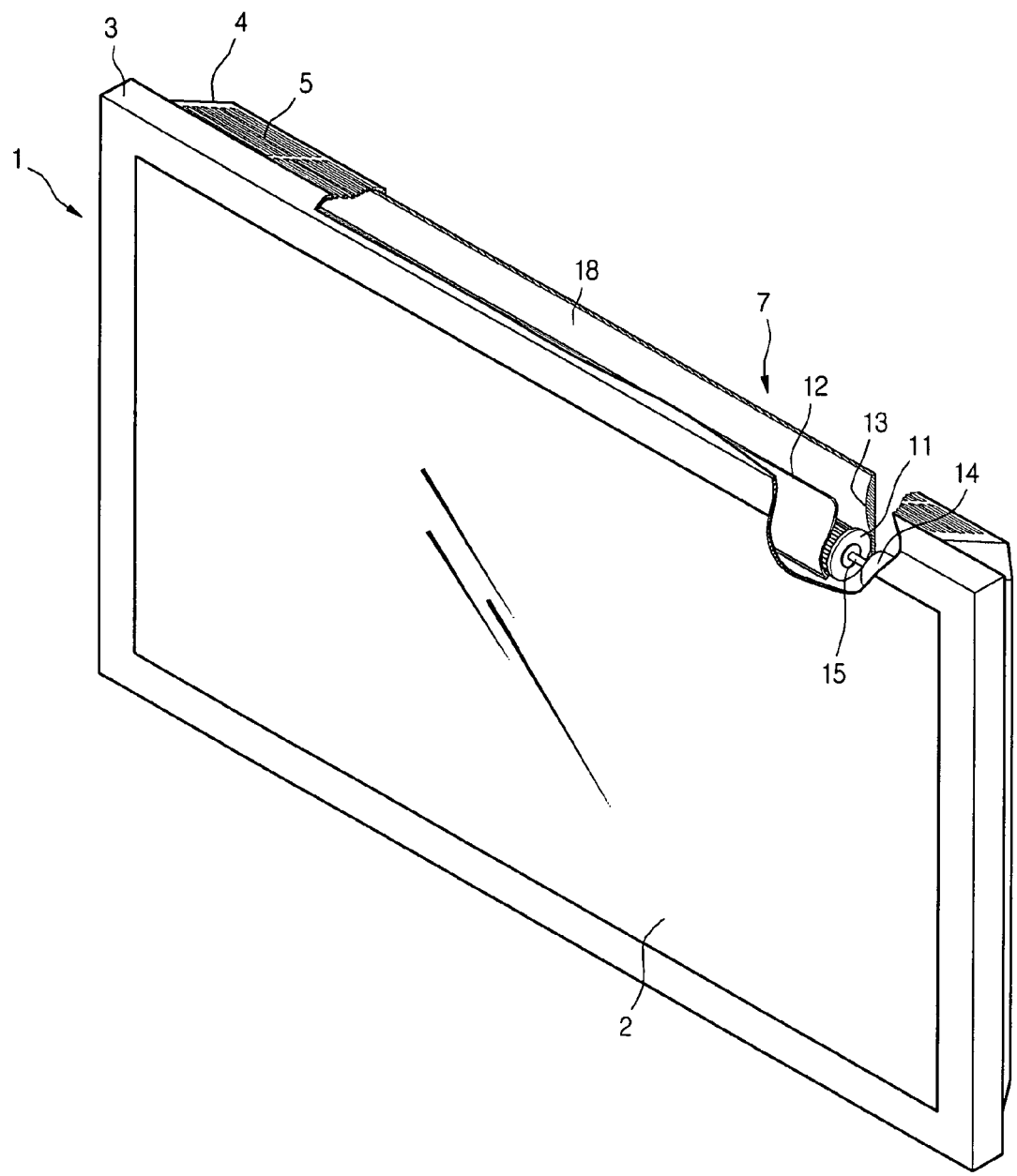
FIG. 2 is a partially broken perspective view of the flat panel display of FIG. 1.

FIG. 2 is a partially broken perspective view of the flat panel display of FIG. 1.

Referring to FIG. 2, a cross-flow fan 7 is installed in an inner-upper portion of the flat display device 1 in a longitudinal direction of the flat display device 1. By the cross-flow fan 7, the top surface of the back cover 4 provides a gap through which the internal hot air is exhausted to the external side. Since the hot air can be exhausted through the top surface of the back cover 4, the air exhaust can be more effectively realized to reduce airflow resistance and airflow noise, thereby enhancing the heat dissipation efficiency of the flat display device.

Describing the cross-flow fan 7 in more detail, the cross-flow fan 7 includes an impeller (10 of FIG. 3) disposed in the longitudinal direction of the back cover 4 and a circular plate 11 for dividing the impeller 10 by a predetermined interval along the longitudinal direction of the impeller 10 and enhancing strength of the impeller. The cross-flow fan 7 is further includes a driving shaft 15 connected to a motor 14. A rotational force of the motor 14 is transferred to the cross-flow fan via the driving shaft 15.

The impeller 10 is disposed in a housing 18 to guide the airflow when the impeller 10 rotates. The housing 18 includes a scroll 12 disposed in front of the impeller 10 and spaced apart from the impeller 10 and a stabilizer 13 disposed in rear of the impeller 10 and spaced apart from the impeller 10. The impeller 10 rotates clockwise in the drawing.

As the impeller 10 rotates clockwise, the air is guided mainly rearward by the impeller 10. Therefore, the hot air exhausted through the display device is not directed toward a user but toward a wall where the display device is mounted. Thus, the user does not feel the displeasure.

Figure 3:
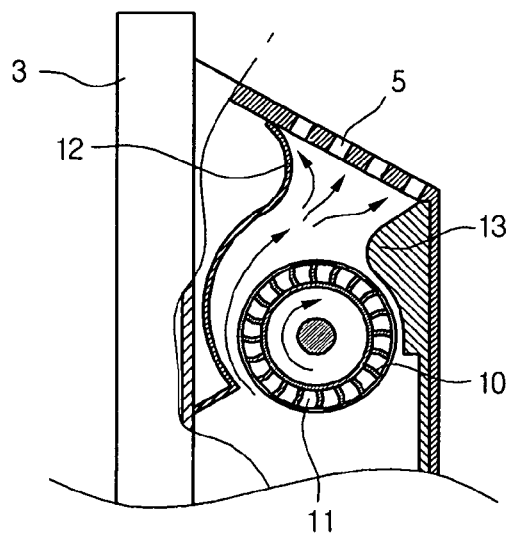
FIG. 3 is a sectional view taken along line I-I'.

FIG. 3 is a sectional view taken along line I-I' of FIG. 1. Referring the FIG. 3, a discharging function of the hot air is explained.

When the cross-flow fan 7 operates clockwise, the internal air of the back cover 4 flows upward and is then exhausted to the external side through the air outlet 5 by being guided by the scroll 12.

As described above, since the cross-fan 7 extends fully relative to the overall longitudinal length of the top surface of the back cover 4, a relatively large amount of air can be exhausted. As described above, since the air exhaust area increases as compared to that of the prior art, the airflow resistance and airflow noise can be reduced. Furthermore, since the hot air is exhausted through the top surface of the back cover 4, there is no need to provide a gap between a wall on which the display device is installed and a rear surface of the back cover 4. Therefore, the flat panel display device can be closely installed on the wall, thereby taking up a relatively small space.

Figure 4:
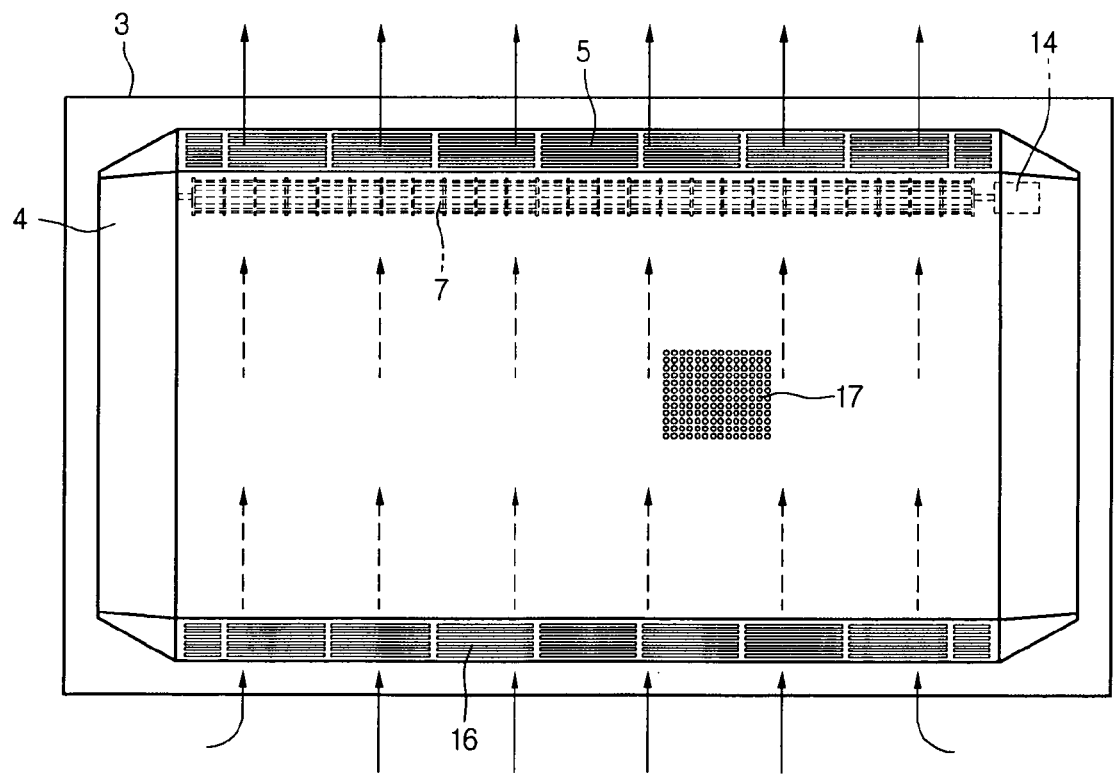
FIG. 4 is a rear view of the flat display device of FIG. 1.

FIG. 4 is a rear view of the flat display device of FIG. 1.

Referring to FIG. 4, the back cover 4 is further provided with an air inlet 16 and a rear air inlet 17.

The air inlet 16 is formed on an inclined portion of the lower inclined portion of the back cover 4 to introduce external cool air into the flat display device. The cool air introduced through the air inlet compensates for the hot air exhausted through the air outlet 5. That is, the cool air introduce compensates for a negative pressure generated by the natural convection and a negative pressure generated by the air exhausted through the air outlet 5.

The cool air introduced through the air inlet 16 cools the components provided on the rear surface of the flat display module 2 and is then exhausted through the air outlet 5 via the cross-flow fan 7.

The air inlet 16 is preferably formed along the overall longitudinal length of the lower peripheral portion of the back cover 4 so that the components can be uniformly cooled. Arrows in the drawing indicates the airflow direction.

The cross-flow fan 7 is formed along the overall longitudinal length of the top surface of the back cover 4 and the effective exhaust area is formed throughout the overall area of the top surface of the back cover 4. Therefore, the cool air introduced through the air inlet 16 flows upward, in the course of which the components is cooled, and is then exhausted through the air outlet. If the length of the cross-flow fan 7 is reduced, the heat dissipation effect at the both inner sides of the flat display device may be reduced. Nevertheless, since the effective exhaust area is large enough, the heat dissipation efficiency can be still improved.

Some of the components (i.e., a power unit) generate high temperature heat and some of the components (i.e., tape carrier package chip (TCP)) require a low temperature condition.

In order to meet the operational condition for each component, it is preferable that the components that require the thermal stability are disposed close to the air inlet 16 so that they can be quickly cooled by the cool air introduced. In addition, the components generating a large amount of heat is preferably disposed close to the cross-flow fan 7 so that the heat generated by the components can be quickly dissipated without affecting on other circuits.

The rear air inlet 17 is provided for the components that cannot be changed their installing location. That is, the rear air inlet 17 is formed on a portion of the back cover 4 corresponding to a specific portion of the flat display module 2 where the heat generation components are disposed. Therefore, the heat generation components disposed corresponding to the rear air inlet 17 can be quickly cooled by the cool air introduced through the rear air inlet 17.

If the installing location of the heat generation components can be changed, the rear air intake opening components may be omitted. That is, the heat generation components may be adjusted in their installing location to be closer to the cross-flow fan 7 or the air inlet 16.

As described above, since the cross-flow fan can be disposed along the overall length of the frame of the back cover 4, the internal hot air of the back cover can be quickly exhausted, thereby improving the heat dissipation efficiency and operational reliability of the flat display device.

Figure 5:
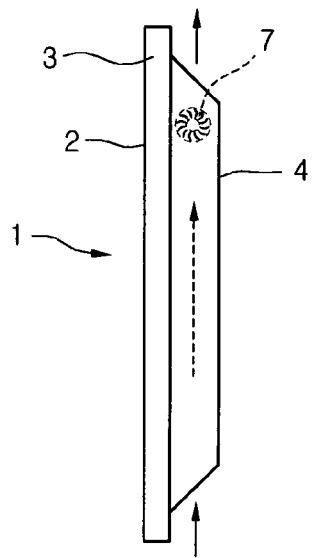
FIG. 5 is a schematic side view of the flat display device of FIG. 1.

FIG. 5 is a side view of the flat display device.

Referring to FIG. 5, heat generated in the flat display device is cooled by the air introduced from the lower portion of the display device. Then, the introduced air flows upward and is forcedly exhausted by the cross-flow fan 7. That is, the air is exhausted above the back cover 3 in a direction extending upward from the flat display device.

As described above, since the air flows by the natural convection where the air flows upward, the airflow resistance can be reduced.

Meanwhile, in this embodiment, a type of the fan is exemplified as a cross-flow fan, however the present invention is not limited thereto. That is, any fans can be used as far as they can be installed in a narrow width. For example, a fan such as a sirocco fan that can generate a large amount of air current may be applied to the present invention.

Second Embodiment

Figure 6:
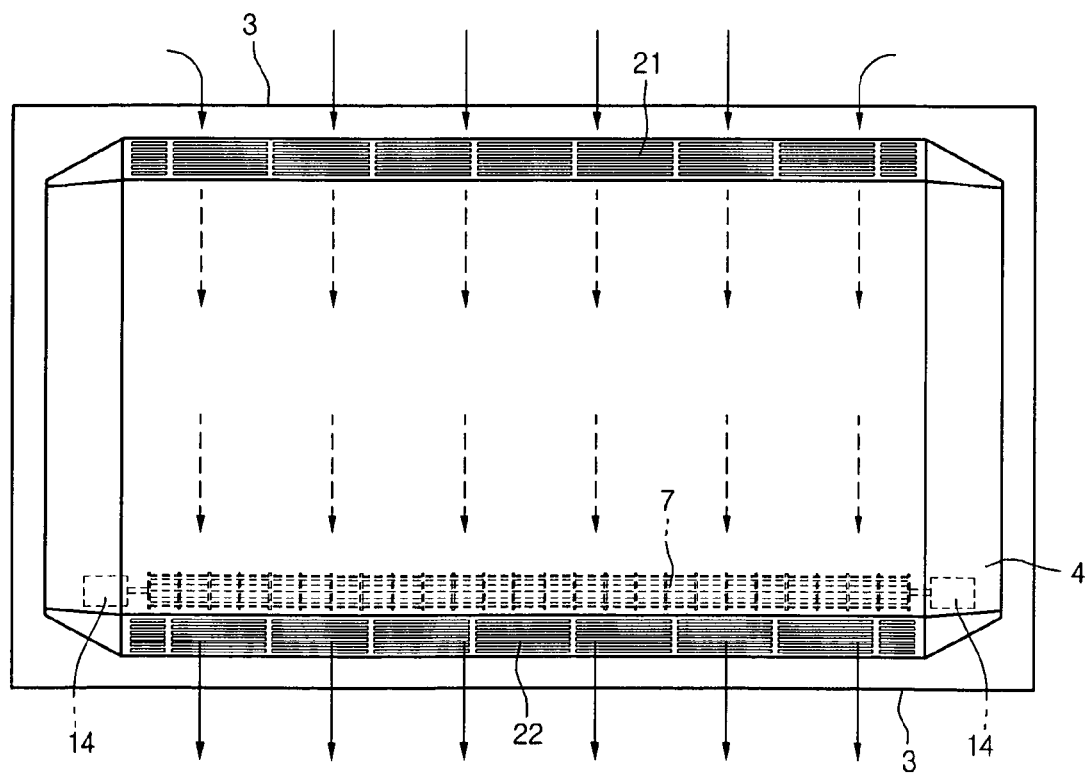
FIG. 6 is a rear view of a flat display device having a cooling apparatus according to another embodiment of the present invention.

FIG. 6 is a rear view of a flat display device according to another embodiment of the present invention. The flat display device of this embodiment is substantially identical to that of FIG. 1 except for the locations of the air inlet and outlet.

Referring to FIG. 6, an air inlet 21 is formed on an upper inclined portion of the back cover 4 while an air outlet 22 is formed on a lower inclined portion of the back cover 4. The cross-flow fan 7 is disposed right above the air outlet 22.

According to this embodiment, it cannot be expected to realize the airflow by the natural convection. However, since the hot air is exhausted downward, the possibility of directing the hot air to the user can be reduced. Furthermore, when the disposition of the components that require the thermal stability or generate high heat is limited due to a circuit arrangement of the flat display module 2, the locations of the air inlet and outlet can be properly adjusted.

Likewise the first embodiment, since the air can be exhausted aligned a lengthwise direction of the flat display device, there is no need to provide a gap between the rear surface of the flat display device and the wall where the flat display device is mounted.

Third Embodiment

Figure 7:
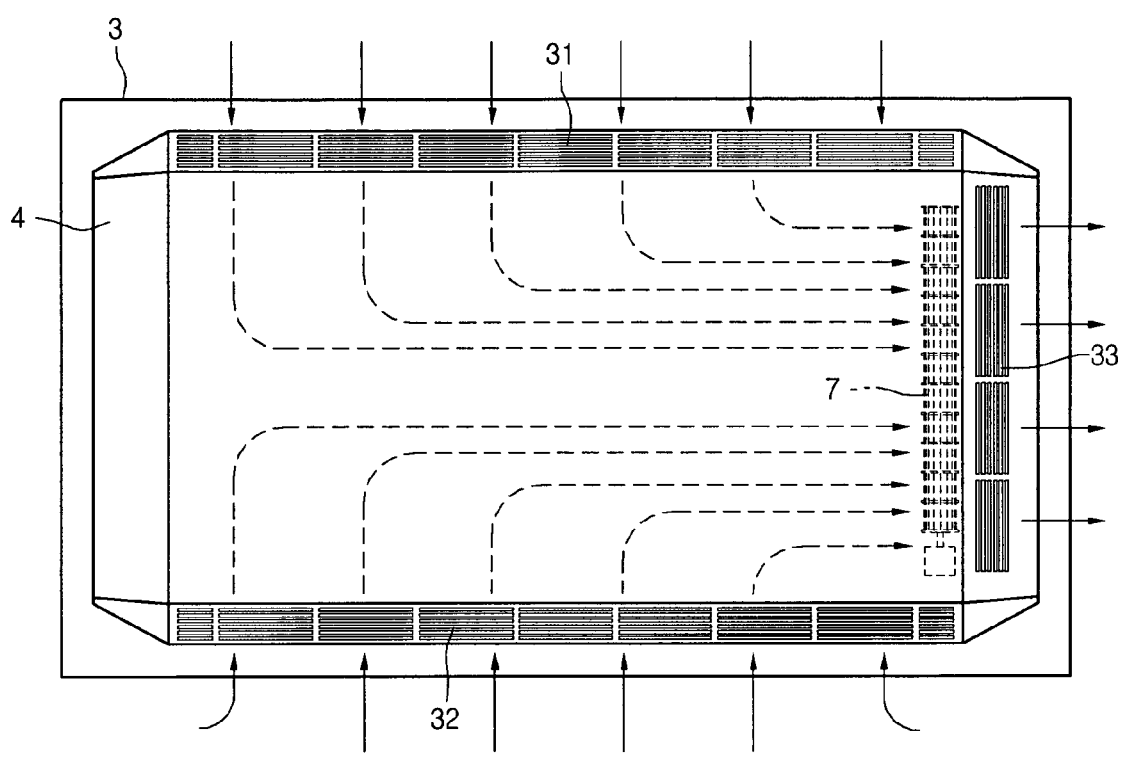
FIG. 7 is a rear view of a flat display device having a cooling apparatus according to another embodiment of the present invention.

FIG. 7 is a rear view of a flat display device according to another embodiment of the present invention. The flat display device of this embodiment is substantially identical to that of FIG. 6 except for the locations of the air inlet and outlet.

Referring to FIG. 7, an air inlet includes first and second inlet portions 31 and 32 that are respectively formed on upper and lower inclined portions of the back cover 4. An air outlet 33 is formed on a left portion (when viewed from a front portion of the display device).

Therefore, external air introduced through the upper and lower portions of the flat display device is exhausted through the air outlet 33 formed on the left frame portion.

According to this third embodiment, a degree of freedom in arranging the circuit of the flat display device can be improved. Likewise the foregoing embodiments, hot air is not directed toward the user. Furthermore, since the external cool air can be introduced through a relatively large space exemplified as the upper and lower portions of the flat display device, the cooling efficiency can be improved. In addition, since the air intake resistance is reduced, the power consumption and noise of the fan can be reduced.

The air outlet 33 may be formed on a right frame portion of the back cover.

Fourth Embodiment

Figure 8:
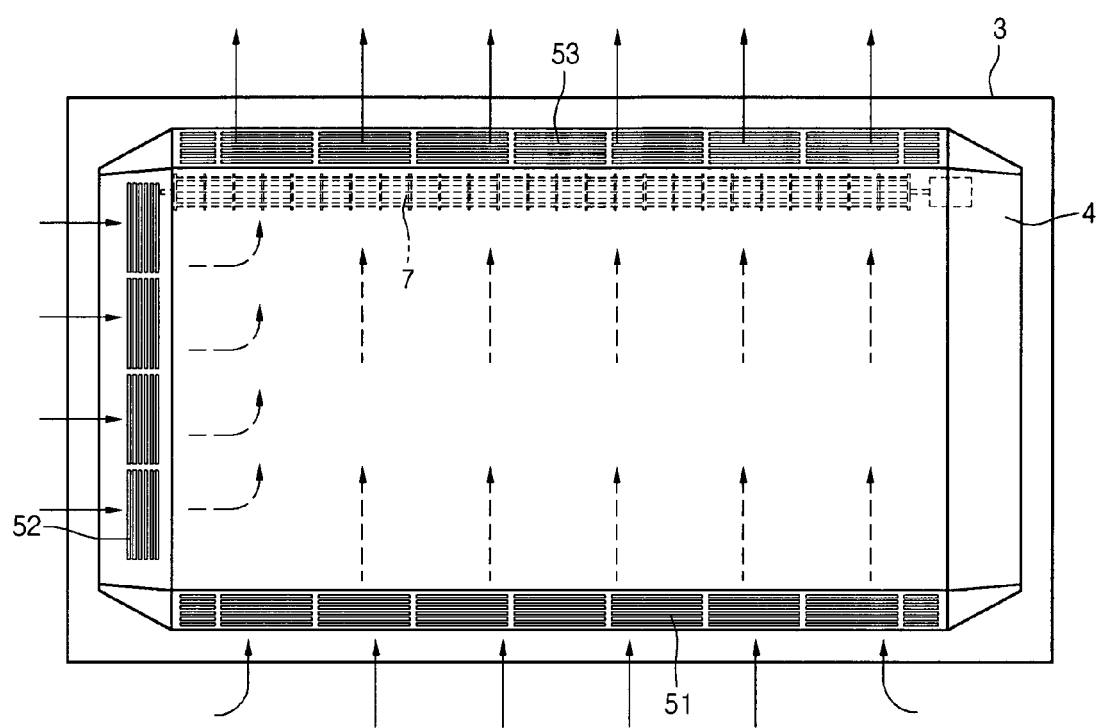
FIG. 8 is a rear view of a flat display device having a cooling apparatus according to another embodiment of the present invention.

FIG. 8 is a rear view of a flat display device according to another embodiment of the present invention. The flat display device of this embodiment is substantially identical to that of FIG. 7 except for the locations of the air inlet and outlet.

Referring to FIG. 7, an air inlet includes first and second inlet portions 51 and 52 that are respectively formed on right (when viewed from a front portion of the display device) and lower portions of the back cover 4. An air outlet 53 is formed on an upper portion (when viewed from a front portion of the display device).

This embodiment may be useful when there is limitation in forming the air outlet on the right portion of the back cover 4.

Fifth Embodiment

Figure 9:
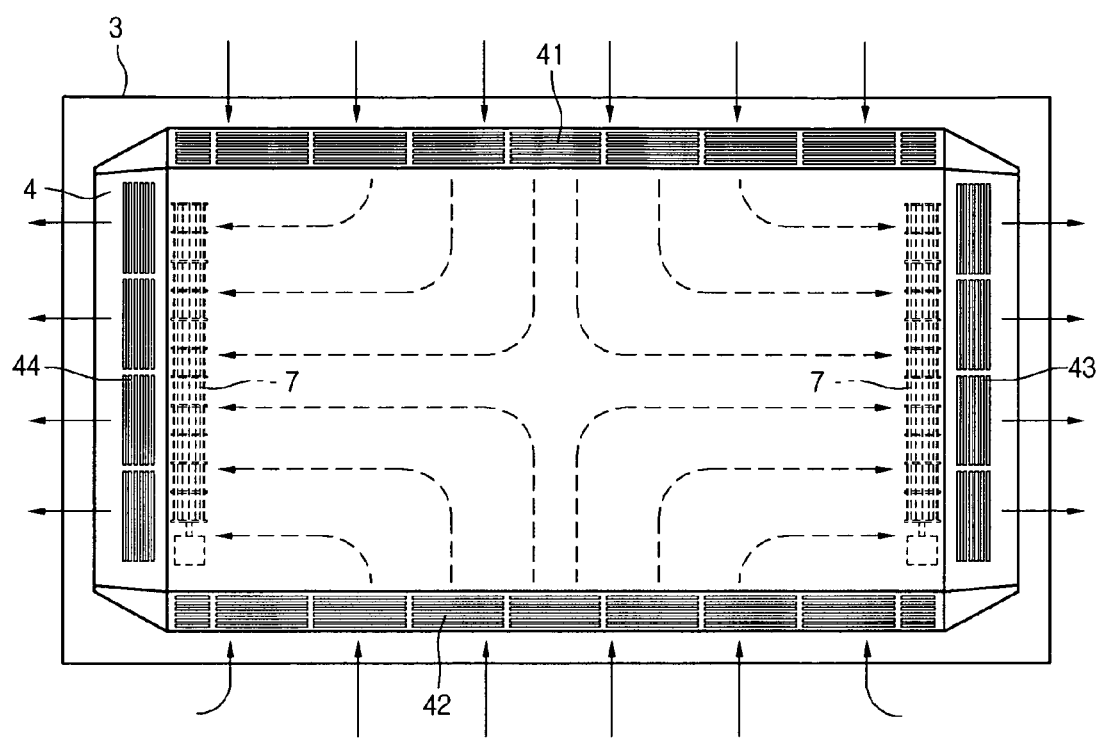
FIG. 9 is a rear view of a flat display device having a cooling apparatus according to another embodiment of the present invention.

FIG. 9 is a rear view of a flat display device according to another embodiment of the present invention. The flat display device of this embodiment is substantially identical to those of the foregoing embodiments except for the locations of the air inlet and outlet.

Referring to FIG. 9, an air inlet includes first and second inlet portions 41 and 42 that are respectively formed on upper and lower portions of the back cover 4. An air outlet includes first and second outlet portions 43 and 44 formed on right and left upper portions (when viewed from a front portion of the display device) of the back cover 4, respectively.

According to this embodiment, since the air inlet and outlet portions are formed for the four frame portions, thereby maximizing the airflow rate. Therefore, the internal heat of the flat display device can be effectively dissipated to the external side. This embodiment may be applied to a flat display device having a screen of more than 50-inch occurring relatively a large amount of heat.

Sixth Embodiment

Figure 10:
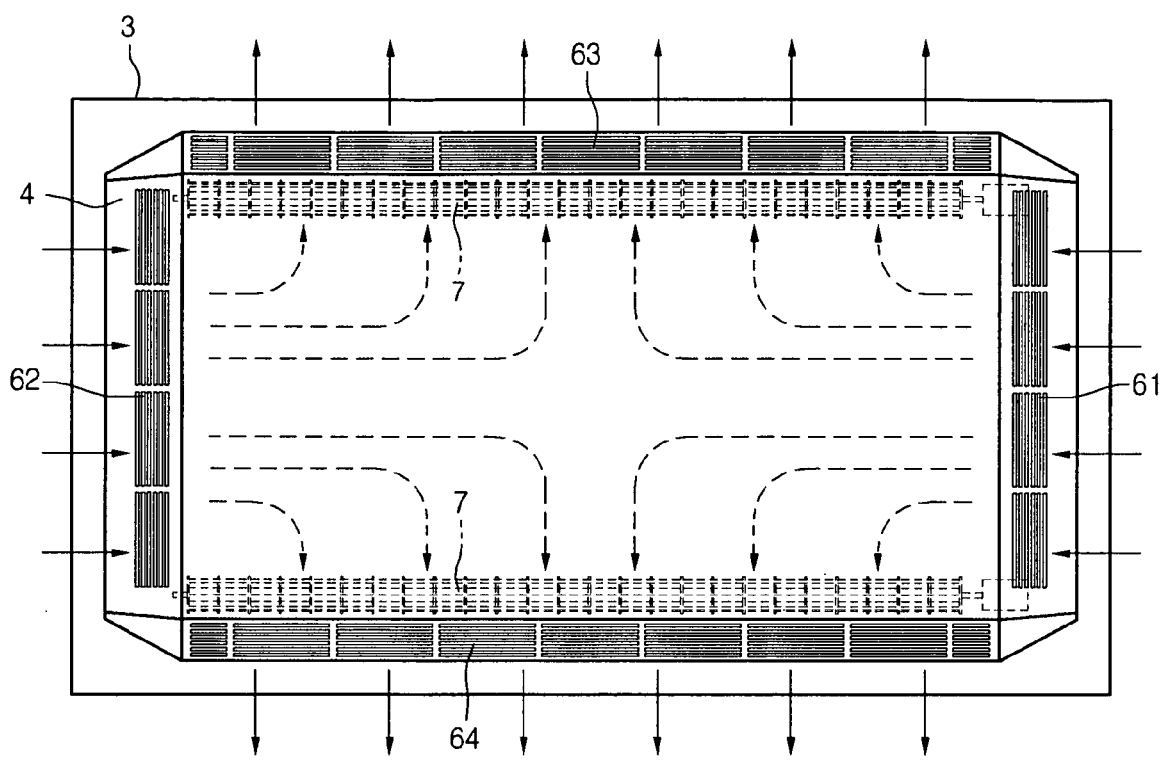
FIG. 10 is a rear view of a flat display device having a cooling apparatus according to another embodiment of the present invention.

FIG. 10 is a rear view of a flat display device according to another embodiment of the present invention. The flat display device of this embodiment is substantially identical to that of FIG. 9 except for the locations of the air inlet and outlet.

Referring to FIG. 10, an air inlet includes first and second inlet portions 61 and 62 that are respectively formed on left and right portions of the back cover 4. An air outlet includes first and second outlet portions 63 and 64 formed on upper and lower portions of the back cover 4, respectively, and having fans 7 right inside thereof so as to forcedly blow the hot air of the flat display device.

According to this embodiment, since an area of the air outlet formed along a longitudinal length of the flat panel display is greater than that of the air inlet formed along a lateral length of the flat panel display, air exhausting force increases and thus the external air is introduced through the air inlet with a high speed, thereby more effectively cooling the components installed near the air inlet.

The present invention is not limited to the foregoing embodiment. For example, the air inlet may be formed on three peripheral portions while the air outlet may be formed on one peripheral portion. In this case, the airflow resistance and the airflow noise can be reduced. Alternatively, the air inlet may be formed on one peripheral portion while the air outlet may be formed on three peripheral portions. In this case, air exhausting force increases and thus the external air is introduced through the air inlet with a high speed, thereby more effectively cooling the components installed near the air inlet.

Alternatively, both the air inlet and outlet may be formed on one peripheral portion. In this case, a predetermined airflow guide may be provided so as not to deteriorate the cooling efficiency of the flat display device. Furthermore, in this case, since the air outlet and inlet are formed on only one frame portion, the outer appearance of the flat display device can be improved. Furthermore, the displeasure of the user, which is caused by the airflow in multi directions, can be reduced.

Alternatively, only the air outlet is formed on the peripheral portion. In this case, the air inlet may be defined on a portion of the front cover 3 or by an inherent gap between the front and back covers, etc. That is, the air inlet may not be formed in a fixed form. However, since the air outlet is a portion through which the internal air is exhausted with a high speed, it is preferable to form the air outlet in a fixed form.

Seventh Embodiment

Figure 11:
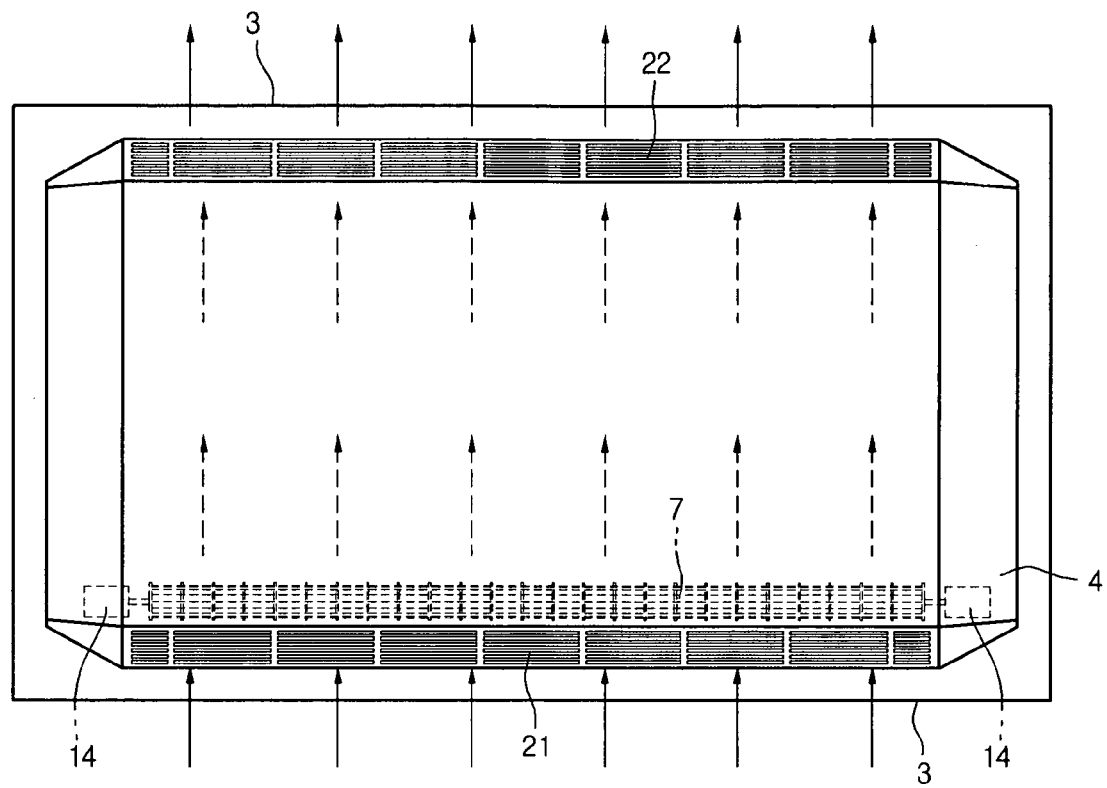
FIG. 11 is a rear view of a flat display device having a cooling apparatus according to another embodiment of the present invention.
Figure 12:
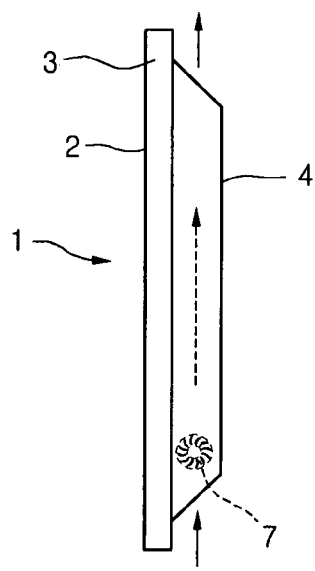
FIG. 12 is a side view of the flat display device of FIG. 11.

FIG. 11 is a rear view of a flat display device according to another embodiment of the present invention and FIG. 12 is a side view of the flat display device of FIG. 11. The flat display device of this embodiment is substantially identical to that of FIG. 6 except for the location and operation of the cross-flow fan.

Referring to FIGS. 11 and 12, an air inlet 21 is formed on a lower portion of the back cover 4 while an air outlet 22 is formed on an upper portion of the back cover 4. The cross-flow fan 7 is installed near the air inlet 21 to forcedly intake the external air.

Likewise the foregoing embodiments, since the air can be exhausted downward of the flat display device, there is no need to provide a gap between the rear surface of the flat display device and the wall where the flat display device is mounted. In this embodiment, the components generating a relatively large amount of heat are disposed near the air inlet 21 so that they can be effectively cooled.

Referring to FIG. 12, since the cross-flow fan 7 is disposed near the air inlet 21, the external air can be effectively introduced through the air inlet 21 by the cross-flow fan 7. The air introduced is heat-exchanged with the internal heat. Then, the air is exhausted to the external side by the natural convection.

The installation of the cross-flow fan near the air inlet can be applied to the embodiments of FIGS. 7 through 10.

Alternatively, the air outlet 22 may be formed on a rear surface of the back cover while the air inlet 21 is formed on the peripheral portion of the back cover 4.

Eighth Embodiment

The eighth embodiment of this invention has a peripheral portion including the air inlet and air outlet together, namely the air inhale and air exhaust is possible at the only one peripheral of the back cover which opens toward the out side of the display device.

Figure 13:
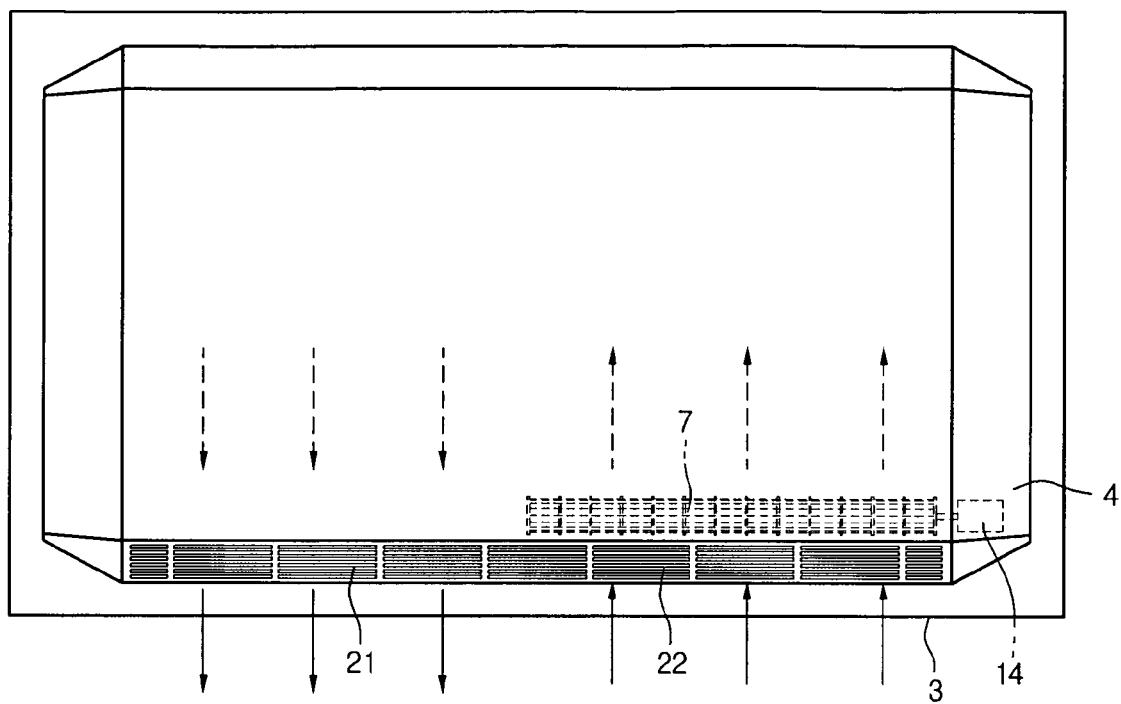
FIG. 13 is a rear view of a flat display device having a cooling apparatus according to another embodiment of the present invention.

FIG. 13 is a rear view of a flat display device according to another embodiment of the present invention.

Referring to FIG. 13, an air inlet 21 is formed on a portion of a lower peripheral portion of the back cover 4 while an air outlet 22 is formed on the rest of the lower peripheral portion of the back cover 4. The cross-flow fan 7 is installed near inside of the air inlet 21.

When the cross-flow fan 7 rotates, the external air is introduced into the display device through the air inlet 21 and is then exhausted to the external side through the air outlet 22.

The present invention is not limited to this embodiment. That is, the inlet and outlet may be formed on an upper peripheral portion or a left or right peripheral portion.

According to the present invention, since no space for installing the blower fan is required, the flat display device can be designed to be slimmer while providing a sufficient heat dissipation effect.

Furthermore, since the air exhaust outlet is formed in a shape similar to a cross section of the flat display device, the structure is simplified and the airflow noise can be minimized.

Since the internal hot air of the flat display device can be exhausted by a negative pressure generated by the fan as well as by the natural convection, the air circulation can be effectively realized in the display device.

The cooling apparatus can improve a degree of installation free of the display device by improving an airflow direction in the flat display device.

The cooling apparatus of the present invention can enhance strength of a back cover by improving location and structure of holes formed on the back cover.

Since the cooling apparatus of the present invention can provide a air inlet and air outlet with a various location and condition, this invention fulfills user's needs and installation necessities.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A cooling apparatus for a flat display device, comprising:
a flat display module;
a cover for protecting the flat display module;
an air inlet formed on a portion of the cover to allow external air to be introduced into the cover;
an air outlet formed on one of four peripheral portions of the cover to allow the air introduced through the air inlet to be exhausted out of the cover; and
a cross-flow fan for directing the air in a direction extending parallel to a screen surface of the flat display device wherein the fan is positioned behind the flat display module and adjacent to the air outlet such that the fan draws external air in through the inlet, across a rear surface of the display module, and then pushes the air out the air outlet.

2. The cooling apparatus according to claim 1, wherein the air inlet and/or air outlet is formed on at least one of the four peripheral portions of the cover.

3. The cooling apparatus according to claim 1, wherein the air inlet and/or air outlet is formed on at least two of the four peripheral portions of the cover.

4. The cooling apparatus according to claim 1, wherein both of the air inlet and air outlet are formed together on at least one of the four peripheral portions of the cover.

5. The cooling apparatus according to claim 1, wherein the air inlet and the air outlet are formed on facing peripheral portions of the cover, respectively.

6. The cooling apparatus according to claim 1, wherein the air inlet is formed on one of the four peripheral portions of the cover.

7. The cooling apparatus according to claim 1, further comprising a housing formed around the fan for guiding an airflow.

8. The cooling apparatus according to claim 7, wherein the housing includes a scroll disposed in front of the impeller and spaced apart from the impeller.

9. The cooling apparatus according to claim 7, wherein the housing includes a stabilizer disposed behind the impeller and spaced apart from the impeller for stabilizing the airflow.

10. A cooling apparatus for a flat display device, comprising:
a flat display module;
a back cover for protecting the flat display module;
an air inlet formed on a bottom portion of the back cover to allow external air to be introduced into the back cover;
an air outlet formed on a top portion of the back cover to allow the air introduced through the air inlet to be exhausted out of the back cover; and
a cross-flow fan mounted behind the display module and adjacent to the air outlet for directing the air in a direction extending parallel to a screen surface of the flat display device.

11. The cooling apparatus according to claim 10, wherein the cross-flow fan extends across substantially the entire width of the back cover.

12. The cooling apparatus according to claim 10, wherein the air inlet and the air outlet are formed on opposite sides of the cover, respectively.

13. The cooling apparatus according to claim 10, wherein the air inlet extends across substantially an entire width of the back cover.

14. The cooling apparatus according to claim 10, wherein the air outlet extends across substantially an entire width of the back cover.

* * * * *